US012277968B2

(12) United States Patent
Lin et al.

(10) Patent No.: US 12,277,968 B2
(45) Date of Patent: Apr. 15, 2025

(54) IN-MEMORY COMPUTATION DEVICE

(71) Applicant: MACRONIX International Co., Ltd., Hsinchu (TW)

(72) Inventors: Yu-Yu Lin, New Taipei (TW); Feng-Min Lee, Hsinchu (TW)

(73) Assignee: MACRONIX International Co., Ltd., Hsinchu (TW)

(*) Notice: Subject to any disclaimer, the term of this patent is extended or adjusted under 35 U.S.C. 154(b) by 209 days.

(21) Appl. No.: 18/330,369

(22) Filed: Jun. 7, 2023

(65) Prior Publication Data
US 2024/0412784 A1    Dec. 12, 2024

(51) Int. Cl.
*G11C 13/00* (2006.01)

(52) U.S. Cl.
CPC ........ *G11C 13/004* (2013.01); *G11C 13/0061* (2013.01); *G11C 2013/0054* (2013.01)

(58) Field of Classification Search
CPC ............ G11C 13/004; G11C 13/0061; G11C 2013/0054
USPC ....................................................... 365/148
See application file for complete search history.

(56) References Cited

U.S. PATENT DOCUMENTS

| 11,657,864 | B1 | 5/2023 | Lin et al. |
| 2021/0064367 | A1 | 3/2021 | Kim et al. |
| 2024/0282382 | A1* | 8/2024 | Lin ............ G11C 16/12 |
| 2024/0355387 | A1* | 10/2024 | Lin ............ G11C 16/26 |

FOREIGN PATENT DOCUMENTS

| CN | 112445456 | 3/2021 |
| TW | 202203007 | 1/2022 |
| TW | 202303382 | 1/2023 |
| TW | 202305672 | 2/2023 |

OTHER PUBLICATIONS

"Office Action of Taiwan Counterpart Application", issued on Jun. 3, 2024, pp. 1-3.

* cited by examiner

*Primary Examiner* — Connie C Yoha
(74) *Attorney, Agent, or Firm* — J.C. PATENTS (57) ABSTRACT

An in-memory computation device includes multiple computation blocks, a first reference weight block, and an output result generator. The computation blocks have multiple weighting values, receive multiple input signals respectively, and generate multiple computation results. Each of the computation blocks generates each of the computation results according to each of the corresponding input signals and corresponding weighting values. The first reference weight block provides a first reference resistance according to multiple reference weighting values and generates a first reference signal according to the first reference resistance and a read voltage. The output result generator generates multiple output computation results according to the first reference signal and the computation results.

13 Claims, 7 Drawing Sheets

IN-MEMORY COMPUTATION DEVICE

BACKGROUND

Technical Field

The disclosure relates to an in-memory computation device, and more particularly to an in-memory computation device capable of adjusting the data extracting time point.

Description of Related Art

With the advancement of electronic technology, the development of artificial intelligence is becoming more and more mature. Subsequently, a large amount of data computing requirements is generated. Accordingly, the in-memory computation device was introduced.

In the conventional technology field, the in-memory computation device often sets a fixed data extracting time point to perform data extraction on the computation result. However, in the neural network, the size of each computing layer is not the same. The delay time for generated computation result by computing layers of different sizes is not the same. Therefore, setting a fixed data extracting time point for the computation result may often cause errors in data extraction or reduce the speed of data extraction.

SUMMARY

The disclosure provides an in-memory computation device, which may effectively provide a data extracting time point of the computation result.

The in-memory computation device of the disclosure includes multiple computation blocks, a first reference weight block, and an output result generator. The computation blocks receive multiple input signals and generating multiple computation results respectively. Each of the computation blocks has multiple weighting values. Each of the computation blocks generates each of the computation results according to each of the corresponding input signals and corresponding weighting values. The first reference weight block provides a first reference resistance according to multiple reference weighting values and generates a first reference signal according to the first reference resistance and a read voltage. The output result generator is coupled to the computation blocks and the first reference weight block and generates multiple output computation results according to the first reference signal and the computation results.

Based on the above, the reference weight block of the disclosure provides the first reference resistance according to a default reference weighting value and generates a reference signal as the basis of the data extraction time according to the first reference resistance. In this way, corresponding to computation blocks of different sizes, the in-memory computation device of the disclosure may set a better data extracting time point and improve the job performance of the in-memory computation device.

DESCRIPTION OF THE EMBODIMENTS

Figure 1:
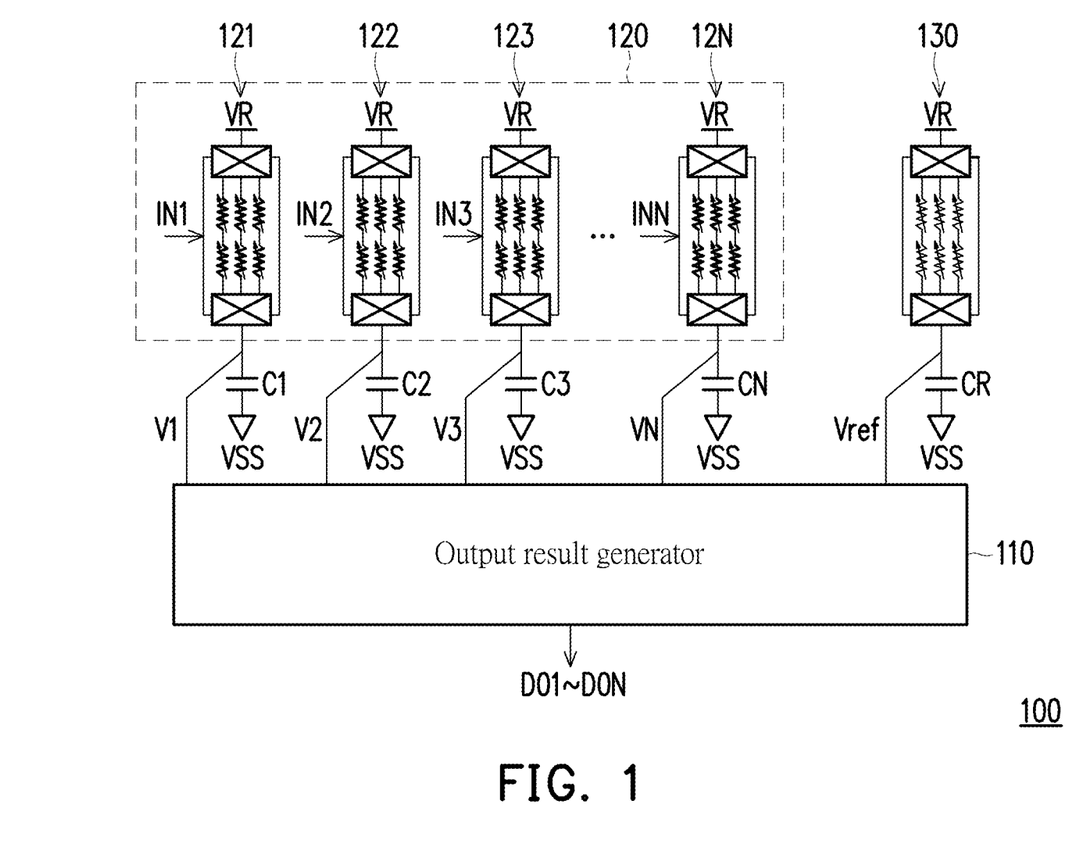
FIG. 1 is a schematic view of an in-memory computation device according to an embodiment of the disclosure.

Referring to FIG. 1, FIG. 1 is a schematic view of an in-memory computation device according to an embodiment of the disclosure. An in-memory computation device 100 includes an output result generator 110, multiple computation blocks 121~12N, and a reference weight block 130. Each of the computation blocks 121~12N has multiple weighting values. The computation blocks 121~12N receive multiple input signals IN1~INN respectively. Each of the computation blocks 121~12N performs calculation according to the weighting value thereof and each of the received input signals IN1~INN and generates computation results V1~VN corresponding to each of the computation blocks 121~12N. In this embodiment, each of the computation blocks 121~12N may perform multiplication and addition operations according to the weighting value thereof and each of the received input signals IN1~INN and transmit the generated computation results V1~VN to the output result generator 110. In addition, the computation blocks 121~12N may be disposed in the same memory 120, and the memory 120 may be any form of non-volatile memory.

To further illustrate, each of the computation blocks 121~12N may include multiple unit circuits, and the unit circuits may be multiple memory cells. By programming each of the memory cells, the weighting value may be written into the memory cell. Each of the memory cells may provide a resistance according to the weighting value thereof and the received input signal IN1~INN. Multiple memory cells in each of the computation blocks 121~12N may be integrated to provide an equivalent resistance. The computation blocks 121~12N receive a read voltage VR and generate a current based on the read voltage VR and the provided equivalent resistance. The computation blocks 121~12N make use of the generated current to charge capacitors C1~CN respectively, so as to generate the computation results V1~VN. The capacitors C1~CN are respectively coupled between the computation blocks 121~12N and a reference ground VSS.

The reference weight block 130 is coupled to the output result generator 110. The reference weight block 130 provides a reference resistance according to multiple reference weighting values. The reference weight block 130 receives the read voltage VR and generates a current according to the reference resistance and the read voltage VR provided, so that the generated current is used to charge a capacitor CR to generate a reference signal Vref.

In detail, the reference weight block 130 may have the same circuit structure as each of the computation blocks 121~12N. The reference weight block 130 may also have a unit circuit for the memory cells. Each of the memory cells has a default reference weighting value and provides a unit resistance according to the reference weighting value thereof. For example, the memory cells in the reference weight block 130 may be divided into multiple first memory cells and multiple second memory cells. The first memory cell may have the same first reference weighting value and provide the same first unit resistance. The second memory cells in the reference weight block 130 may have the same second reference weighting value and provide the same second unit resistance. The first reference weighting value is different from the second reference weighting value, and the first unit resistance is different from the second unit resistance. For example, the first unit resistance may be high resistance, and the second unit resistance may be low resistance. By integrating the first memory cell and the second memory cell, the reference weight block 130 may generate the reference resistance according to the first unit resistance and second unit resistance.

Incidentally, the amount of the first memory cell is the same as or different from the amount of the second memory cell. For example, the amount of the first memory cell may be ½, ¼, or ⅛ of all the memory cells in the reference weight block 130, and there is no certain limit.

On the other hand, the output result generator 110 may generate multiple output computation results DO1~DON respectively corresponding to the computation blocks 121~12N according to the reference signal Vref and the computation results V1~VN. The output result generator 110 may generate the computation results V1~VN by comparing each of the computation results V1~VN with the reference signal Vref.

In detail, the reference signal Vref may be used to indicate the time point for extracting the computation results V1~VN. The output result generator 110 extracts the computation results V1~VN according to extract time information indicated by the reference signal Vref and generates the output computation results DO1~DON respectively.

Figure 2:
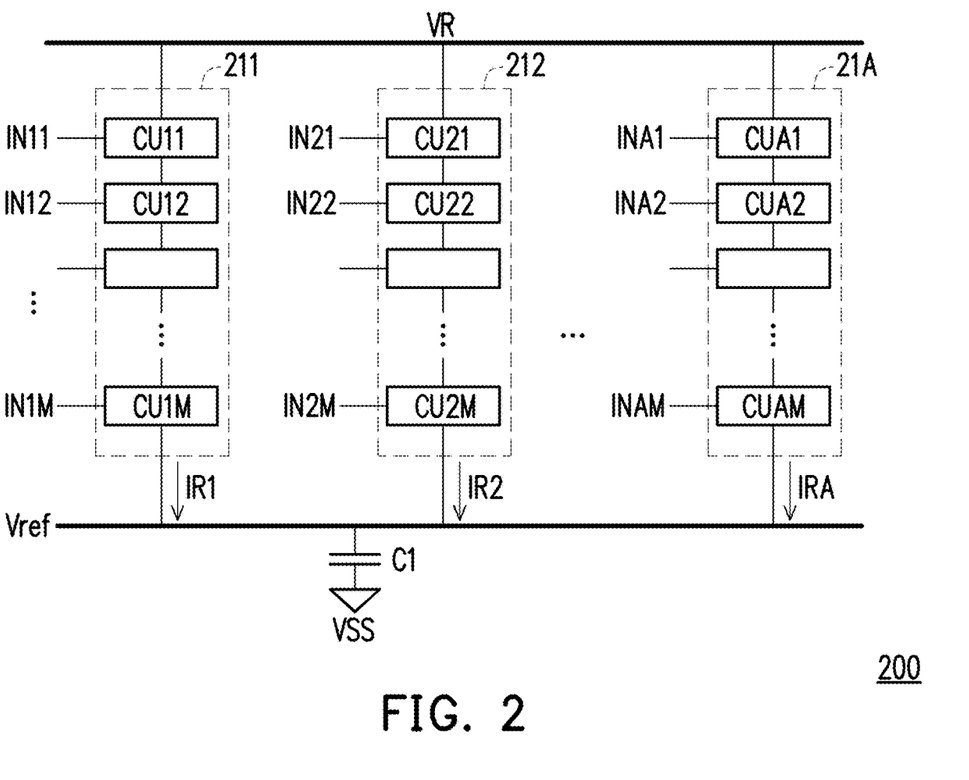
FIG. 2 is a schematic view of the implementation of a reference weight block in an in-memory computation device according to an embodiment of the disclosure.

Referring to FIG. 2, FIG. 2 is a schematic view of the implementation of a reference weight block in an in-memory computation device according to an embodiment of the disclosure. The reference weight block 200 includes multiple unit circuit strings 211~21A. The unit circuit strings 211~21A are connected in parallel between the read voltage VR and one end of the capacitor C1, and the other end of the capacitor C1 is coupled to the reference ground VSS.

The unit circuit string 211 has multiple unit circuits CU11~CU1M connected in series; the unit circuit string 212 has multiple unit circuits CU21~CU2M connected in series; . . . ; the unit circuit string 21A has multiple unit circuits CUA1~CUAM connected in series. Each of the unit circuits CU11~CUAM has a reference weighting value, and may provide a unit resistance according to the reference weighting value. In this embodiment, the unit circuits CU11~CUAM may receive input signals IN11~INAM respectively. In this way, based on the read voltage VR, each of the unit circuit strings 211~21A may respectively provide currents IR1~IRA to the capacitor C1 for charging, thereby generating the reference signal Vref.

Figure 3A:
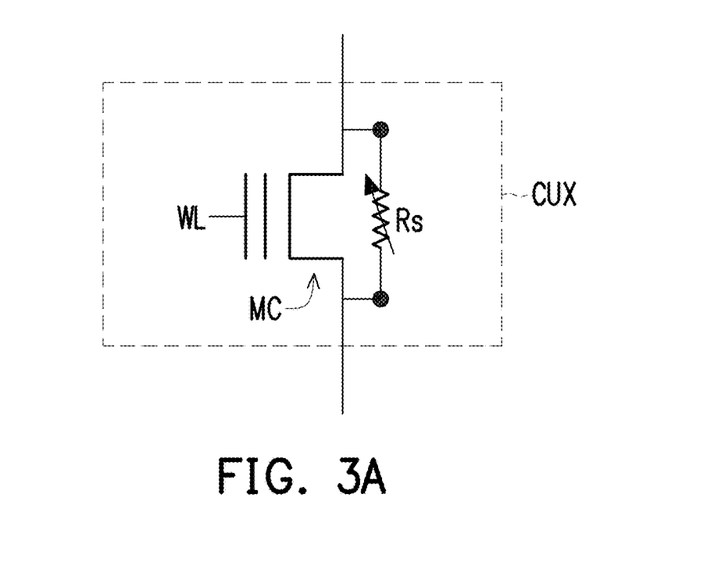
FIG. 3A is a schematic view of a unit circuit according to an embodiment of the disclosure.

It is worth mentioning that each of the unit circuits CU11~CUAM may be a flash memory cell. For example, FIG. 3A is a schematic view of a unit circuit according to an embodiment of the disclosure. The unit circuit CUX in FIG. 3A may be any one of the unit circuits CU11~CUAM in FIG. 2. The unit circuit CUX is a flash memory cell MC and may receive input signal through a word line WL. When setting the reference weighting value of the unit circuit CUX, the flash memory cell MC may be programmed, and a threshold voltage of the flash memory cell MC may be adjusted. The flash memory cell MC may provide a unit resistance Rs according to the reference weighting value thereof. In this embodiment, the amount of the unit circuit in the reference weight block is the same as the amount of the weighting value in each of the computation blocks 121~12N.

Referring to FIG. 2 again, the unit circuit strings 211~21A may have multiple resistances respectively and may generate multiple currents IR1~IRA respectively according to the read voltage VR.

Figure 3B:
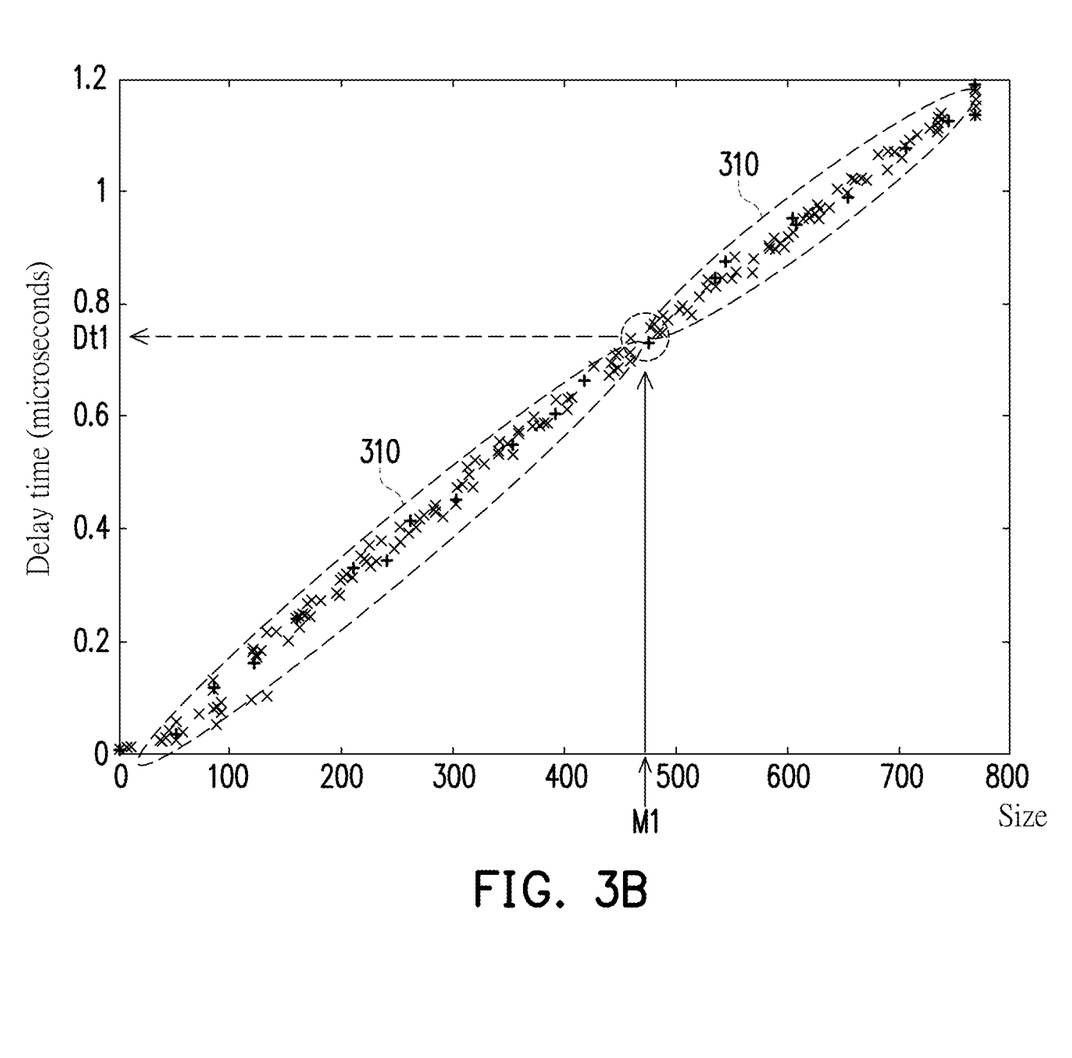
FIG. 3B shows the relationship between the size of the in-memory computation device and the delay time of the generated computation result correspondingly according to an embodiment of the disclosure.

Referring to FIG. 3B, FIG. 3B shows the relationship between the size of the in-memory computation device and the delay time of the computation result generated correspondingly according to an embodiment of the disclosure. The vertical axis of FIG. 3B is the delay time, and the horizontal axis is the size of the computation result of the computation block. A simulation is carried out according to the size of different computation results, sizes corresponding to different computation results may be obtained, thereby generating the correspondence of the delay time of effective computation results. According to the above correspondence, a distribution area 310 with linearization tendency may be obtained.

In this embodiment, in response to the size of the computation result of the computation block in the in-memory computation device being M1 (between 400 and 500), an expected delay time Dt1 may be calculated through the distribution area 310. According to the delay time Dt1, the reference resistance provided by the reference weight block may be set, and the reference weighting value may be set according to the calculated reference resistance.

In this way, according to the reference weighting value, the reference signal generated by the reference weight block may be used as the basis for extracting the computation result during an effective time.

Figure 4:
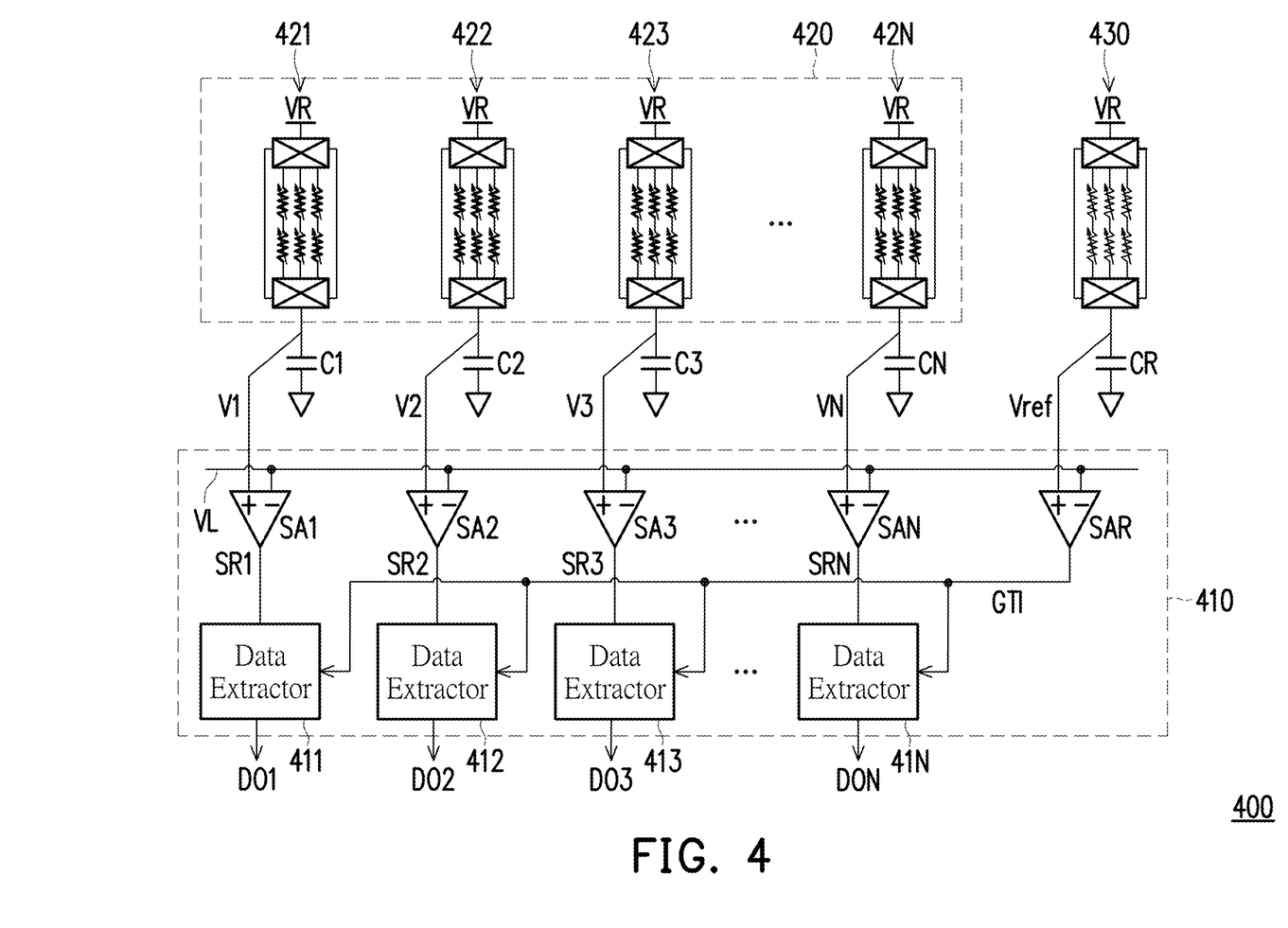
FIG. 4 is a schematic view of an in-memory computation device according to another embodiment of the disclosure.

Referring to FIG. 4, FIG. 4 is a schematic view of an in-memory computation device according to another embodiment of the disclosure. An in-memory computation device 400 includes an output result generator 410, multiple computation blocks 421~42N, and a reference weight block 430. The computation blocks 421~42N are respectively coupled to the capacitors C1~CN, and the reference weight block 430 is coupled to the capacitor CR. The computation blocks 421~42N generate the computation results V1~VN respectively, and the reference weight block 430 is used to generate the reference signal Vref.

The reference weight block 430 includes sense amplifiers SA1~SAN, and SAR, and data extractors 411~41N. The sense amplifiers SA1~SAN receive computation results V1~VN respectively. The sense amplifiers SA1~SAN jointly receive a sensing reference signal VL and generate multiple sensing results SR1~SRN respectively by sensing the computation results V1~VN respectively according to the sensing reference signal VL. The sense amplifier SAR receives the reference signal Vref and the sensing reference signal VL and senses the reference signal Vref according to the sensing reference signal VL to generate extract time information GTI.

The data extractors 411~41N are respectively coupled to the sense amplifiers SA1~SAN and the sense amplifier SAR. The data extractors 411~41N receive the sensing results SR1~SRN respectively and jointly receive the extract time information GTI. The data extractors 411~41N extract the sensing results SR1~SRN according to the extract time information GTI to generate output results DO1~DON respectively. The data extractors 411~41N may execute the data extraction of the sensing results SR1~SRN at an appropriate time point according to the extract time information GTI.

Incidentally, the sense amplifiers SA1~SAN, and SAR in this embodiment may be implemented using a sensing amplifier circuit well known to those with ordinary knowledge in this field without any specific restrictions. The data extractors 411~41N are circuit elements, such as D-type flip-flops, which may perform data extraction based on the extract time information GTI as a trigger point.

It is worth noting that in the reference weight block 430, the more the amount of the unit circuit that provides high resistance, the longer the delay time of the provided extract time information GTI may be. Therefore, by adjusting the amount of the unit circuit providing high resistance in the reference weight block 430, the extract time information GTI may be changed.

Figure 5:
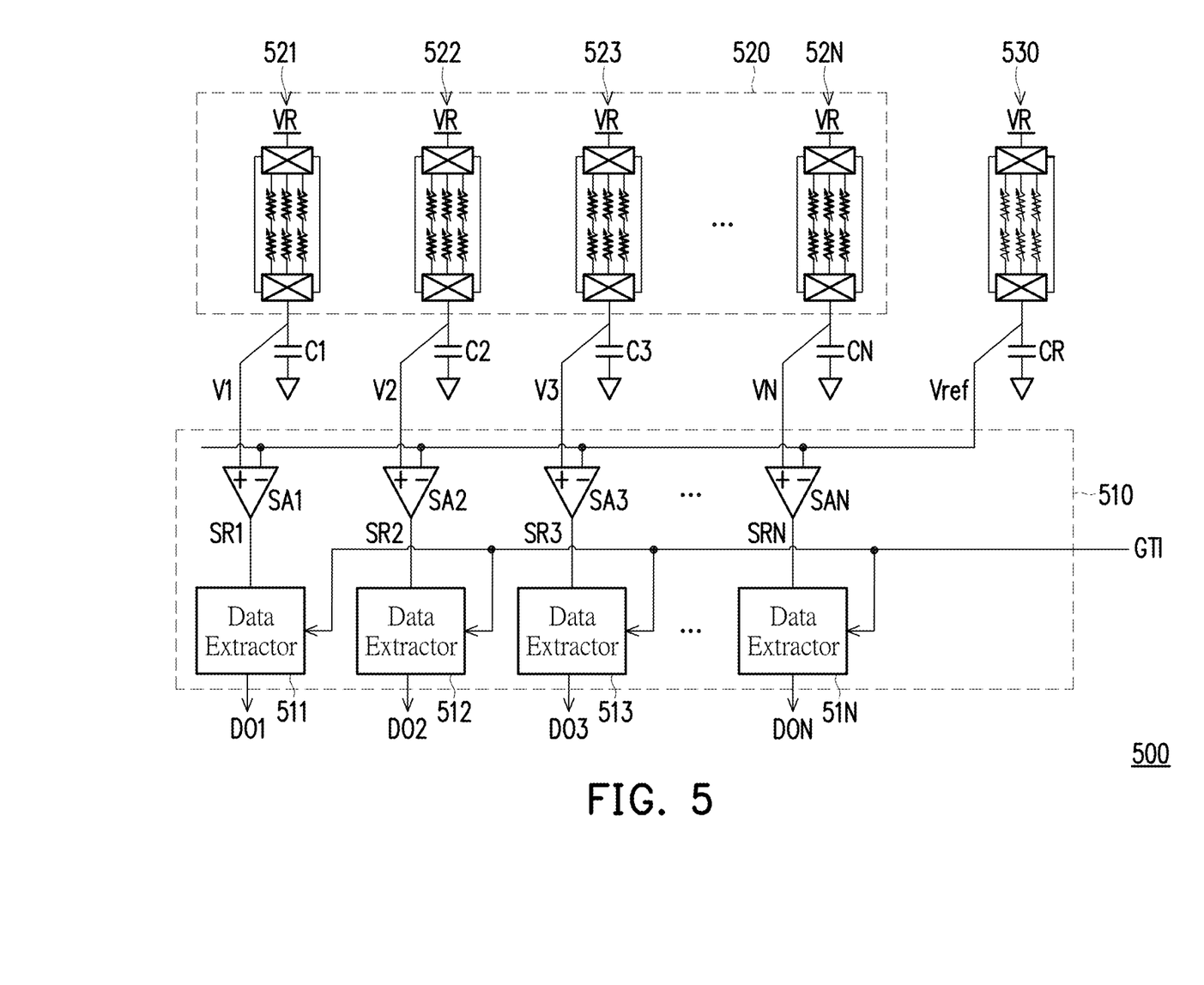
FIG. 5 is a schematic view of an in-memory computation device according to another embodiment of the disclosure.

Referring to FIG. 5, FIG. 5 is a schematic view of an in-memory computation device according to another embodiment of the disclosure. An in-memory computation device 500 includes an output result generator 510, multiple computation blocks 521~52N, and a reference weight block 530. The computation blocks 521~52N are respectively coupled to the capacitors C1~CN, and the reference weight block 530 is coupled to the capacitor CR. The computation blocks 521~52N generate the computation results V1~VN respectively, and the reference weight block 530 is used to generate the reference signal Vref.

Different from the embodiment in FIG. 4, the reference weight block 530 includes sense amplifiers SA1~SAN and data extractors 511~51N. The sense amplifiers SA1~SAN respectively receive the computation result V1~VN and jointly receive the reference signal Vref. The sense amplifiers SA1~SAN sense the computation results V1~VN respectively according to the reference signal Vref to generate the sensing results SR1~SRN respectively.

The data extractors 511~51N are respectively coupled to the sense amplifiers SA1~SAN. The data extractors 511~51N receive the sensing results SR1~SRN respectively and jointly receive the extract time information GTI. In this embodiment, the extract time information GTI is a default signal and may be input externally. The data extractors 511~51N extract the sensing results SR1~SRN according to the extract time information GTI to generate output results DO1~DON respectively.

Figure 6:
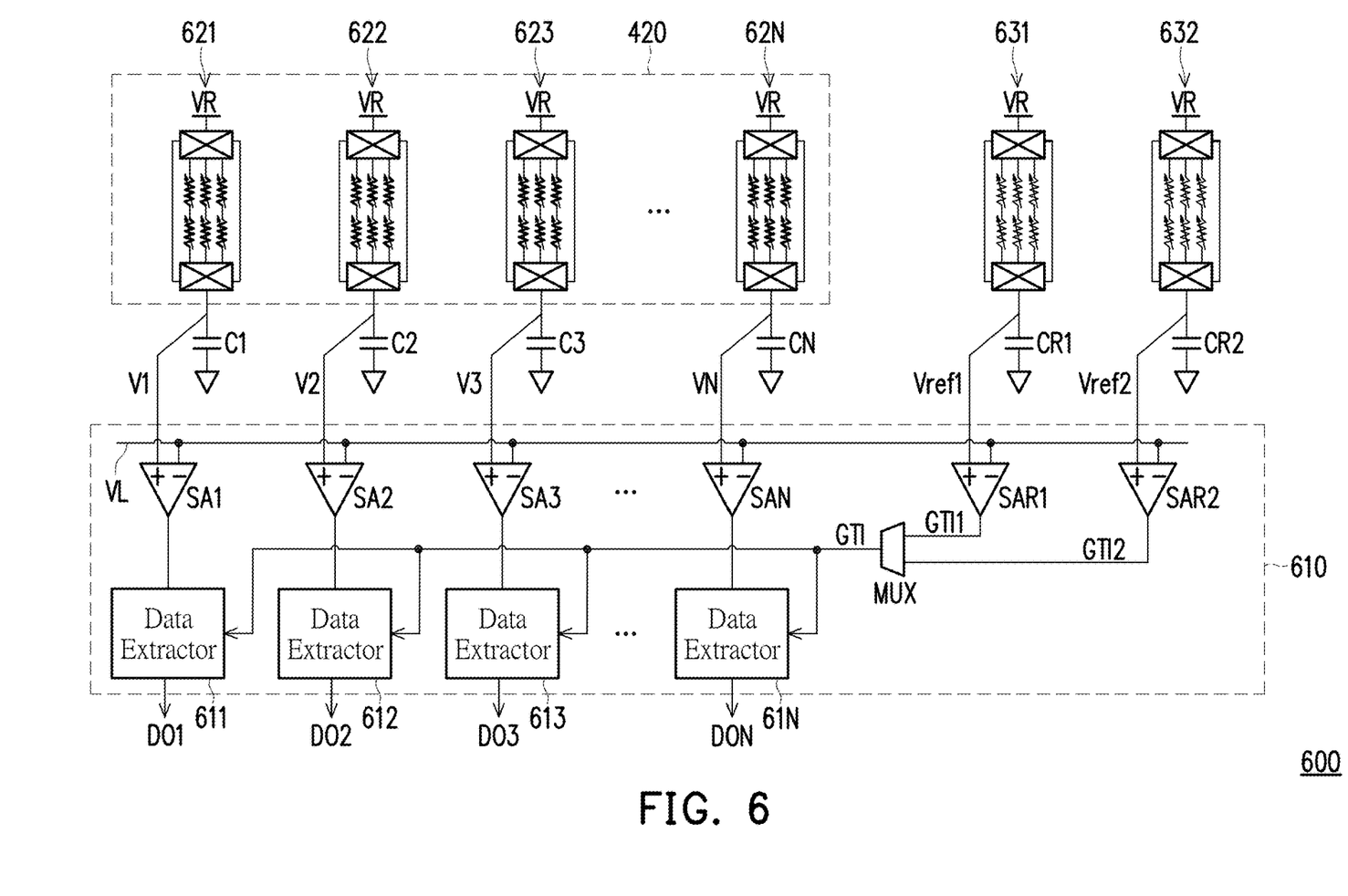
FIG. 6 is a schematic view of an in-memory computation device according to another embodiment of the disclosure.

Referring to FIG. 6, FIG. 6 is a schematic view of an in-memory computation device according to another embodiment of the disclosure. An in-memory computation device 600 includes an output result generator 610, multiple computation blocks 621~62N, and reference weight blocks 631 and 632. The computation blocks 621~62N are respectively coupled to the capacitors C1~CN, and the reference weight blocks 631 and 632 are respectively coupled to the capacitors CR1 and CR2. The computation blocks 621~62N generate the computation results V1~VN respectively, and the reference weight blocks 631 and 632 are used to generate reference signals Vref1 and Vref2 respectively.

The output result generator 610 includes sense amplifiers SA1~SAN, SAR1, and SAR2, data extractors 611~61N, and a multiplexer MUX. The sense amplifiers SA1~SAN receive computation results V1~VN respectively. The sense amplifiers SA1~SAN jointly receive a sensing reference signal VL and generate multiple sensing results SR1~SRN respectively by sensing the computation results V1~VN respectively according to the sensing reference signal VL. The sense amplifiers SAR1 and SAR2 respectively receive the reference signals Vref1 and Vref2, and jointly receive the sensing reference signal VL. The sense amplifiers SAR1 and SAR2 respectively generate extract time information GTI1 and GTI2 according to the sensing reference signal VL and the sensing reference signals Vref1 and Vref2.

The multiplexer MUX is coupled between the sense amplifiers SAR1 and SAR2 and the data extractors 611~61N. The multiplexer MUX may select one of the extract time information GTI1 and GTI2 according to a selection signal to generate the extract time information GTI and output the extract time information GTI to the data extractors 611~61N. The data extractors 611~61N are respectively coupled to the sense amplifiers SA1~SAN. The data extractors 611~61N receive the sensing results SR1~SRN respectively and jointly receive the extract time information GTI. The data extractors 611~61N extract the sensing results SR1~SRN according to the extract time information GTI to generate output results DO1~DON respectively.

In this embodiment, the reference signals Vref1 and Vref2 respectively provided by the reference weight blocks 631 and 632 may correspond to different time delays. Thus, the sense amplifiers SAR1 and SAR2 generate the extract time information GTI1 and GTI2 respectively corresponding to different data extraction times respectively. In this way, in this embodiment, by sequentially selecting the extract time information GTI1 or GTI2 to generate the extract time information GTI, the data extractors 611~61N may perform multi-stage data extraction at different data extraction time points.

It is worth mentioning that in other embodiments of the disclosure, the reference weight block may be more than two. Designers may adjust the amount of the reference weight block according to actual needs, and there is no fixed limit.

Figure 7:
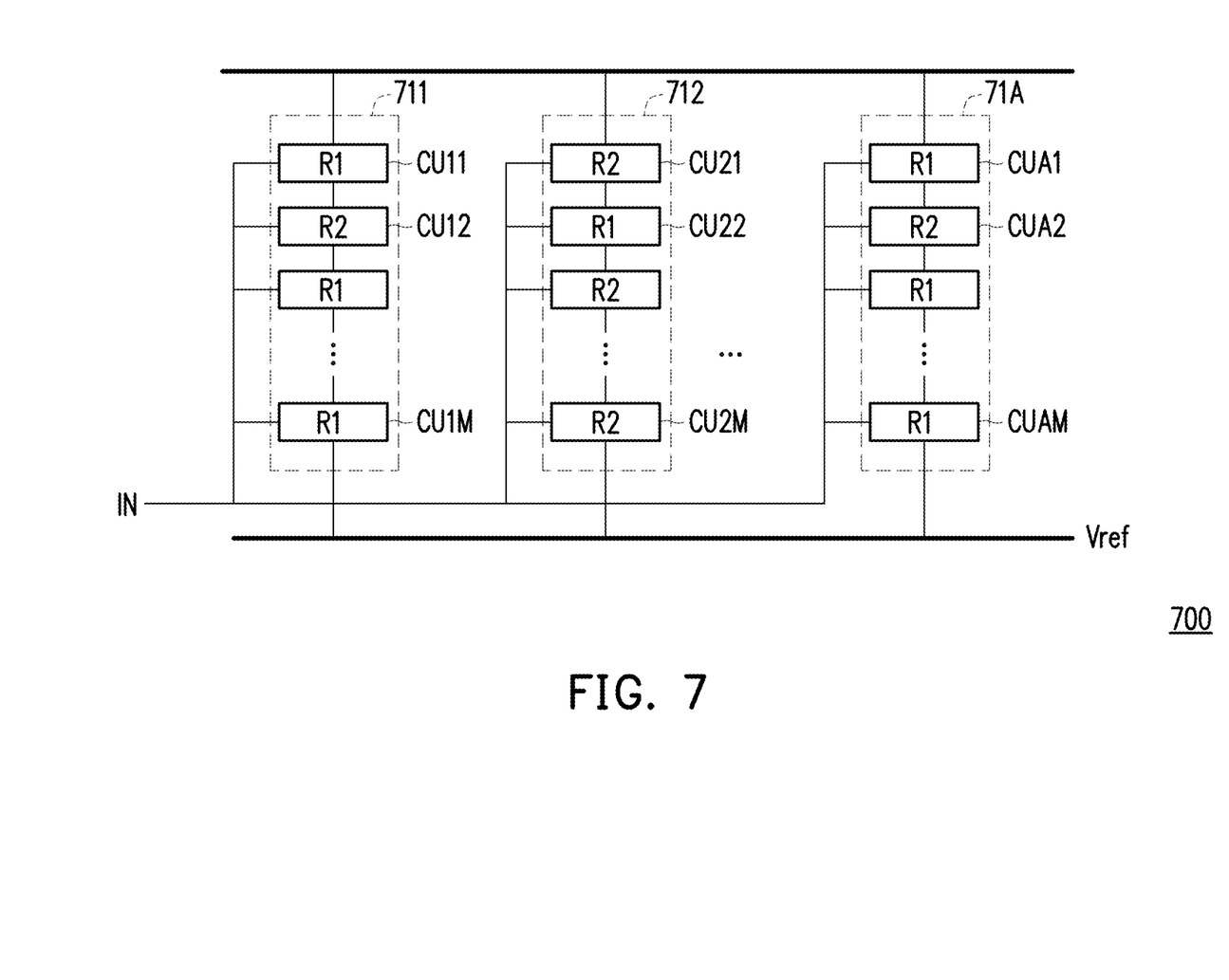
FIG. 7 is a schematic view of the implementation of a reference weight block according to an embodiment of the disclosure.

Referring to FIG. 7, FIG. 7 is a schematic view of the implementation of a reference weight block according to an embodiment of the disclosure. The reference weight block 700 includes multiple unit circuit strings 711~71A. The unit circuit string 711 has multiple unit circuits CU11~CU1M connected in series; the unit circuit string 712 has multiple unit circuits CU21~CU2M connected in series; . . . ; the unit circuit string 71A has multiple unit circuits CUA1~CUAM connected in series.

In this embodiment, each of the unit circuits CU11~CUAM may provide a unit resistance according to the reference weighting value thereof. Among the unit circuits CU11~CUAM, a portion of the first unit circuits provides relatively high resistance R1, and another portion of the second unit circuits provides relatively low resistance R2. The reference signal Vref provided by the reference weight block 700 may be adjusted by adjusting the ratio of the first unit circuit in all unit circuits CU11~CUAM. The above ratio may be any value between 1 and 0.

In response to multiple reference weight blocks being disposed in the in-memory computation device, in the reference weight block, the ratio of the unit circuits that provide relatively high resistance R1 may be different. For example, in response to the amount of the reference weight block being 4, the above ratios may be ¼, 2/4, ¾, and 4/4 respectively.

Incidentally, the unit circuits CU11~CUAM all receive the same input signal IN. The input signal IN may have a fixed and relatively low voltage value.

To sum up, by disposing the reference weight block, the in-memory computation device of the disclosure provides a reference signal according to multiple reference weighting values and sets the data extracting time point of the computation result according to the reference signal. In this way, corresponding to computation blocks of different sizes, the in-memory computation device of the disclosure may set a better data extracting time point and improve the job performance of the in-memory computation device.

What is claimed is:

1. An in-memory computation device, comprising:
a plurality of computation blocks, receiving a plurality of input signals and generating a plurality of computation results respectively, wherein each of the computation blocks has a plurality of weighting values, and each of the computation blocks generates each of the computation results according to each of the corresponding input signals and corresponding weighting values;
a first reference weight block, providing a first reference resistance according to a plurality of reference weighting values and generating a first reference signal according to the first reference resistance and a read voltage; and
an output result generator, coupled to the computation blocks and the first reference weight block and generating a plurality of output computation results according to the first reference signal and the computation results.

2. The in-memory computation device according to claim 1, wherein the first reference weight block comprises:
a plurality of unit circuit strings connected in parallel with each other, wherein each of the unit circuit strings has a plurality of unit circuits connected in series, and the unit circuits respectively provide a plurality of unit resistances according to the reference weighting values.

3. The in-memory computation device according to claim 2, wherein an amount of the unit circuits is same as an amount of the weighting values of each of the computation blocks.

4. The in-memory computation device according to claim 2, wherein a plurality of first unit circuits of the unit circuits provide a same first unit resistance, a plurality of second unit circuits of the unit circuits provide a same second unit resistance, and the first unit resistance is different from the second unit resistance.

5. The in-memory computation device according to claim 4, wherein an amount of the first unit circuits is same as or different from an amount of the second unit circuits.

6. The in-memory computation device according to claim 1, wherein the output result generator comprises:
a plurality of first sense amplifiers, coupled to the computation blocks respectively and sensing the computation results respectively according to a sensing reference signal to generate a plurality of sensing results respectively;
a second sense amplifier, coupled to the first reference weight block and sensing the first reference signal according to the sensing reference signal to generate extract time information; and
a plurality of data extractors, coupled to the first sense amplifier and the second sense amplifier and extracting the sensing results according to the extract time information to generate a plurality of output results respectively.

7. The in-memory computation device according to claim 1, wherein the output result generator comprises:
a plurality of first sense amplifiers, coupled to the computation blocks respectively and sensing the computation results respectively according to the first reference signal to generate a plurality of sensing results respectively; and
a plurality of data extractors, coupled to the first sense amplifiers and extracting the sensing results according to default time information to generate a plurality of output results respectively.

8. The in-memory computation device according to claim 1, further comprising:
at least one second reference weight block, providing at least one second reference resistance according to at least one second reference weighting value and generating at least one second reference signal according to the at least one second reference resistance and the read voltage.

9. The in-memory computation device according to claim 8, wherein the output result generator comprises:
a plurality of first sense amplifiers, coupled to the computation blocks respectively and sensing the computation results respectively according to a sensing reference signal to generate a plurality of sensing results respectively;
a plurality of second sense amplifiers, coupled to the first reference weight block and the at least one second reference weight block respectively and sensing the first reference signal and the at least one second reference signal according to the sensing reference signal to generate a plurality of extract time information respectively;
a multiplexer, coupled to the second sense amplifiers and selecting one of the extract time information for output; and
a plurality of data extractors, coupled to the first sense amplifiers and the multiplexer and extracting the sensing results according to an output of the multiplexer to generate a plurality of output results respectively.

10. The in-memory computation device according to claim 2, wherein the first reference weight block further comprises:
a capacitor, having a first end coupled to the unit circuit strings and a second end coupled to a reference ground, wherein the first end of the capacitor provides the first reference signal.

11. The in-memory computation device according to claim 10, wherein each of the computation blocks provides a current signal to the capacitor for charging according to each of the corresponding input signals and the corresponding weighting values and generates each of the computation results.

12. The in-memory computation device according to claim 1, wherein the reference weighting value is determined according to amounts of the computation blocks and the weighting values.

13. The in-memory computation device according to claim 1, wherein each of the computation blocks comprises:
a plurality of unit circuit strings, wherein the unit circuit strings are connected in parallel, each of the unit circuit strings has a plurality of unit circuits connected in series, and each of the unit circuits has the weighting value and provides a resistance according to the weighting value.

* * * * *